(12) United States Patent
Choi et al.

(10) Patent No.: US 8,536,785 B2
(45) Date of Patent: Sep. 17, 2013

(54) ORGANIC LIGHT EMITTING DISPLAY AND METHOD FOR MANUFACTURING THE SAME

(75) Inventors: Young-Seo Choi, Suwon-si (KR); Kwan-Hee Lee, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 188 days.

(21) Appl. No.: 12/191,244

(22) Filed: Aug. 13, 2008

(65) Prior Publication Data

US 2009/0189517 A1 Jul. 30, 2009

(30) Foreign Application Priority Data

Jan. 30, 2008 (KR) .................. 10-2008-0009614

(51) Int. Cl.
*H05B 33/00* (2006.01)
*H05B 33/04* (2006.01)

(52) U.S. Cl.
USPC .............. 313/512; 313/504; 313/506; 257/99

(58) Field of Classification Search
None
See application file for complete search history.

(56) References Cited

U.S. PATENT DOCUMENTS

| | | | | |
|---|---|---|---|---|
| 6,380,672 B1 * | 4/2002 | Yudasaka | ...................... | 313/504 |
| 6,930,449 B2 * | 8/2005 | Sasatani et al. | ............... | 313/512 |
| 6,992,439 B2 * | 1/2006 | Yamazaki et al. | ............ | 313/512 |
| 6,992,440 B2 * | 1/2006 | Ishida | ........................... | 313/512 |
| 7,045,944 B2 * | 5/2006 | Ushifusa et al. | .............. | 313/489 |
| 7,306,346 B2 * | 12/2007 | Fukuoka et al. | ................. | 362/84 |
| 7,601,236 B2 * | 10/2009 | Yamashita et al. | ............ | 156/230 |
| 8,044,426 B2 | 10/2011 | Hwang et al. | | |
| 2002/0180371 A1 | 12/2002 | Yamazaki et al. | | |
| 2003/0113581 A1 * | 6/2003 | Gotou | ........................... | 428/690 |
| 2004/0095060 A1 * | 5/2004 | Ushifusa et al. | .............. | 313/495 |
| 2006/0055313 A1 | 3/2006 | Bae et al. | | |
| 2006/0192487 A1 | 8/2006 | Choi et al. | | |
| 2006/0197446 A1 * | 9/2006 | Tomimatsu et al. | .......... | 313/512 |
| 2007/0267648 A1 | 11/2007 | Hwang et al. | | |
| 2008/0030128 A1 | 2/2008 | Kim | | |
| 2008/0036367 A1 * | 2/2008 | Eida et al. | ..................... | 313/504 |
| 2009/0167171 A1 * | 7/2009 | Jung et al. | ..................... | 313/504 |

FOREIGN PATENT DOCUMENTS

| | | |
|---|---|---|
| CN | 1750720 A | 3/2006 |
| CN | 1969595 A | 5/2007 |
| CN | 101075612 A | 11/2007 |
| EP | 1 246 509 A2 | 10/2002 |
| EP | 1 784 054 A1 | 5/2007 |
| JP | 9-330792 | 12/1997 |

(Continued)

OTHER PUBLICATIONS

KIPO Notice of Allowance dated Feb. 28, 2008 for priority Korean application 10-2008-0009614.

SIPO Office action dated Mar. 1, 2010, for corresponding Chinese Patent application 200910008534.8, as well as U.S. Publication 2002/0180371, previously filed in an IDS dated Aug. 5, 2009.

(Continued)

*Primary Examiner* — Sikha Roy

(74) *Attorney, Agent, or Firm* — Christie, Parker & Hale, LLP

(57) ABSTRACT

An organic light emitting display includes a first substrate including a plurality of anode electrodes on an insulating layer and a plurality of pixel definition layers around the plurality of anode electrodes. An impact absorbing layer is spaced from the plurality of pixel definition layers, and a spacer is on an upper surface of the impact absorbing layer. A second substrate faces the first substrate and is spaced from the first substrate by the spacer.

9 Claims, 1 Drawing Sheet

(56) References Cited

FOREIGN PATENT DOCUMENTS

| JP | 2002-324666 | 11/2002 |
| JP | 2004-288456 | 10/2004 |
| JP | 2004-319118 | 11/2004 |
| JP | 2006-236963 | 9/2006 |
| JP | 2007-329448 | 12/2007 |
| KR | 1020050030296 A | 3/2005 |
| KR | 10-2006-0077898 | 7/2006 |
| KR | 1020070030058 A | 3/2007 |
| KR | 1020070117118 A | 12/2007 |

OTHER PUBLICATIONS

European Search Report dated May 14, 2009, for corresponding European application 09250255.8.
Japanese Office action dated Jun. 1, 2010, for corresponding Japanese Patent application 2008-115941.
Japanese Office action dated Nov. 6, 2012, for corresponding Japanese Patent application 2008-115941, (3 pages).
SIPO Certificate of Patent dated Mar. 27, 2013, with English translation of cover page, for corresponding Chinese Patent application 200910008534.8, (3 pages).

* cited by examiner

ORGANIC LIGHT EMITTING DISPLAY AND METHOD FOR MANUFACTURING THE SAME

CROSS-REFERENCE TO RELATED APPLICATIONS

This application claims priority to and the benefit of Korean Patent Application No. 10-2008-0009614, filed on Jan. 30, 2008, in the Korean Intellectual Property Office, the entire content of which is incorporated herein by reference.

BACKGROUND OF THE INVENTION

1. Field of the Invention

The present invention relates to an organic light emitting display and a method for manufacturing the same.

2. Description of Related Art

Recently, various flat panel display devices having reduced weight and volume compared to cathode ray tube device have been developed. Exemplary flat panel display devices include a liquid crystal display (LCD), a field emission display (FED), a plasma display panel (PDP) and an organic light emitting display (OLED), among others.

An organic light emitting display displays an image using an organic light emitting diode (OLED) generating light by recombination of electrons and holes.

An organic light emitting diode includes an anode electrode, a cathode electrode and an emission layer positioned between the anode electrode and the cathode electrode. When a current flows in a direction from the anode electrode to the cathode electrode, a color is expressed through light emission.

The market for such organic light emitting displays having excellent color reproducibility, a relatively thin configuration, etc. has been largely expanded into various applications such as personal digital assistants (PDAs), MP3 players, etc. in addition to cellular phones.

A conventional organic light emitting display may include a transparent substrate on which a thin film transistor and an organic light emitting diode etc. are formed, and a seal substrate sealing the transparent substrate. A spacer is included between the transparent substrate and the seal substrate in order to constantly maintain a distance therebetween.

In the organic light emitting display constituted as above, when impact is applied to the seal substrate or the transparent substrate from the outside, the impact may be transferred to the spacer.

The impact transferred to the spacer can also be transferred to the organic light emitting diode, thereby damaging the organic light emitting diode. In particular, the greater the impact strength transmitted, the greater the degree of damage to the organic light emitting diode becomes. A damaged organic light emitting diode does not emit light, potentially causing blurs to appear on the organic light emitting display.

The occurrence of a defect to an internal device is checked by a bending test and a ball drop test to evaluate the device's strength. If the device does not endure a threshold strength, the device is judged as insufficient to be launched in the market.

Accordingly, the strength of a device's organic light emitting display is important, and increasing the device's strength is also important.

SUMMARY OF THE INVENTION

According to aspects of the present invention, an organic light emitting display is provided with improved durability by including an impact absorbing layer and a method for manufacturing the same.

In one embodiment of the present invention, an organic light emitting display is provided including a first substrate having a plurality of anode electrodes on an insulating layer and a plurality of pixel definition layers around the plurality of anode electrodes. An impact absorbing layer is spaced from the plurality of pixel definition layers, and a spacer is on the impact absorbing layer. A second substrate faces the first substrate and is spaced from the first substrate by the spacer.

In one embodiment, an inert gas or an organic material is in a space between the first substrate and the second substrate. Further, the pixel definition layer and the impact absorbing layer may comprise the same material and may be formed by the same process.

In another embodiment, a method for manufacturing an organic light emitting display is provided including forming a thin film transistor on glass, forming an insulating layer on an upper surface of the thin film transistor, forming a plurality of anode electrodes electrically coupled to the thin film transistor on the insulating layer, forming a plurality of pixel definition layers positioned around the plurality of anode electrodes and impact absorbing layers spaced from the plurality of pixel definition layers by forming and patterning the insulating layer on the plurality of anode electrodes, and forming a spacer on the impact absorbing layer.

BRIEF DESCRIPTION OF THE DRAWINGS

The accompanying drawings, together with the specification, illustrate exemplary embodiments of the present invention, and, together with the description, serve to explain the principles of the present invention.

DETAILED DESCRIPTION

Figure 1:
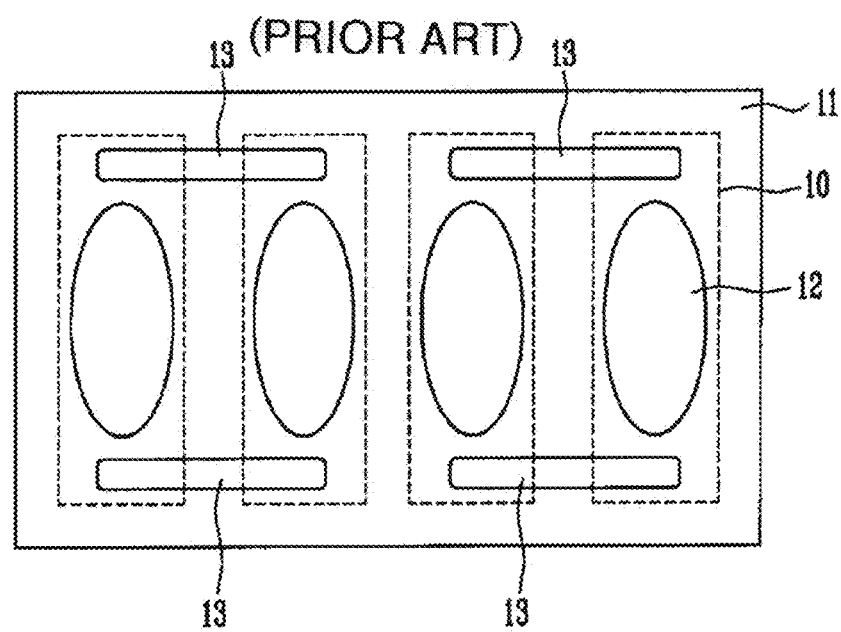
FIG. 1 is a plan view showing an organic light emitting display.

In the following detailed description, only certain exemplary embodiments of the present invention have been shown and described, simply by way of illustration. As those skilled in the art will realize, the described embodiments may be modified in various ways without departing from the spirit or scope of the present invention. Accordingly, the drawings and description are to be regarded as illustrative in nature and not restrictive. In addition, when an element is referred to as being "on" another element, it can be directly on the element or be indirectly on the element with one or more intervening elements interposed therebetween. Also, when an element is referred to as being "connected to" another element, it can be directly connected to the element or be indirectly connected to the element with one or more intervening elements interposed therebetween. Hereinafter, like reference numerals refer to like elements.

FIG. 1 is a plan view showing an organic light emitting display.

Referring to FIG. 1, an organic light emitting display includes a transparent substrate and a seal substrate. Herein, the transparent substrate includes a thin film transistor, an insulating layer and an anode electrode 10 of the organic light emitting diode, etc. formed on an upper surface thereof. Also, a pixel definition layer (PDL) layer 11 is formed on the upper surface of the anode electrode 10. The anode electrode is exposed in a specific region, for example, an emission region 12 that emits light. The emission region 12 is formed with an emission layer to form an organic light emitting diode. The organic light emitting diode is electrically coupled to the thin film transistor to emit light corresponding to a signal transmitted from thin film transistor. A plurality of spacers 13 are formed on one region of the PDL layer 11. The spacers 13 function to constantly maintain a distance between the transparent substrate and the seal substrate.

When impact from the outside is applied to the seal substrate or the transparent substrate of the organic light emitting display constituted as above, the impact is transferred to the spacer 13.

When the impact is transferred to the spacer 13, the impact may be further transferred to the PDL layer 11 on the lower surface of the spacer. The impact transferred to the PDL layer 11 can also be transferred to the emission layer and the anode electrode 10. Therefore, if the transferred impact strength is large, the organic light emitting diode may be damaged, preventing the organic light emitting diode from emitting light. As such, blurs may appear on the organic light emitting display.

Accordingly, embodiments of the present invention include an organic light emitting display having an impact absorbing layer to prevent or significantly reduce damage to the organic light emitting display. Hereinafter, the detailed description thereof will be provided with reference to FIG. 2.

Figure 2:
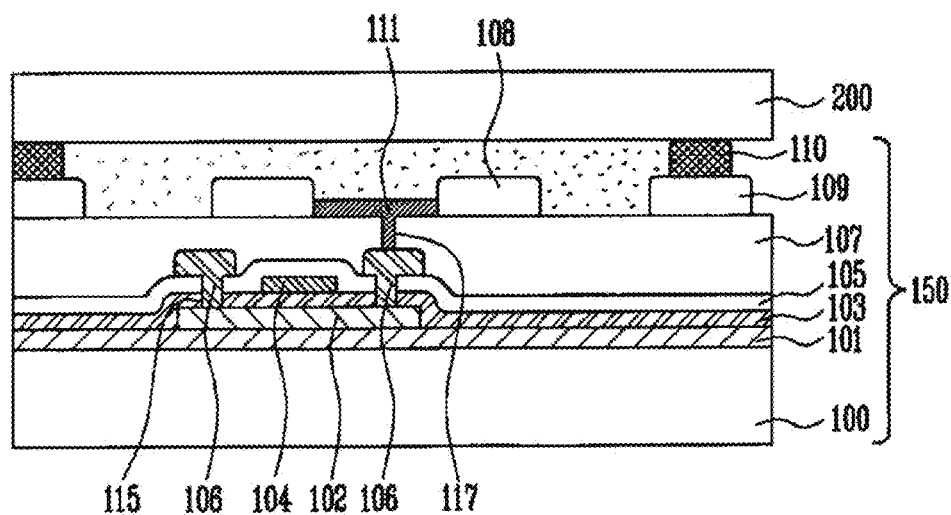
FIG. 2 is a cross-sectional view of the organic light emitting display according to an embodiment of the present invention.

FIG. 2 is a cross-sectional view of a light emitting region of an organic light emitting display according to an embodiment of the present invention. With reference to FIG. 2, the light emitting region of the organic light emitting display includes a transparent substrate 150 and a seal substrate 200 sealing the transparent substrate 150. Accordingly, the light emitting region can display images to be viewed by a viewer.

A buffer layer 101 is formed on the glass 100 of the transparent substrate 150 and a semiconductor layer 102 is formed on the upper surface of the buffer layer 101. An insulation layer 103 is formed on the upper surface of the semiconductor layer 102, and a gate electrode 104 is formed by forming and patterning a metal layer on the upper surface of the insulation layer 103. An ion doping process is performed on the semiconductor layer 102.

An insulation layer 105 is formed on the upper surface of gate electrode 104 and then a contact hole 115 is formed in the insulation layer. A source drain metal 106 is formed by forming and patterning the metal layer on the upper surface of the semiconductor layer 102. The source drain metal 106 may contact both ends of the semiconductor layer 102 through the contact hole 115.

The insulation layer 107 is formed to have a flattened upper surface. A contact hole 117 is then formed in the insulation layer 107, and the anode electrode 111 is formed on the insulation layer 107. The anode electrode 111 contacts the source drain metal 106 through the contact hole 117.

The insulation layer is formed on the anode electrode 111. The insulation layer becomes PDL layer 108 and an impact absorbing layer by means of an etching of the insulation layer. The PDL layer 108 is a film defining region in which an organic light emitting diode is formed. The anode electrode 111 is exposed to the inside of the PDL layer 108. The emission layer (not shown) is formed on the upper surface of anode electrode 111 and a cathode electrode is formed on the upper of thereof to form the organic light emitting diode.

The impact absorbing layer 109 and the PDL layer 108 are formed to be spaced from each other. Therefore, although an impact may be applied to the impact absorbing layer 109, it is not transferred to the PDL layer 108. In other words, although force generated by the impact from the outside is applied to the impact absorbing layer 109, the force is not transferred to the emission layer formed on the PDL layer 108.

The spacer 110 is formed on the upper of the impact absorbing layer to maintain the distance between the transparent substrate 150 and the seal substrate 200. At this time, the spacer 110 can be formed to contact the seal substrate 200 and can be formed to be spaced at a distance therefrom. If the impact is applied from the outside, the impact is applied to the spacer 110. As such, the impact applied to the spacer 110 is transferred to only the impact absorbing layer 109, thereby protecting the emission layer.

The transparent substrate 150 and seal substrate 200 of the organic light emitting display may be adhered to each other by means of epoxy or frit, among other fasteners or adherents. An inert gas such as N2 is injected to a space between the transparent substrate 150 and the seal substrate 200.

Also, in order to further increase the device strength, various reinforcing materials such organic materials, etc. are formed between the transparent substrate 150 and the seal substrate 200.

As mentioned above, with the organic light emitting display and the method for making the same according to embodiments of present invention, the impact absorbing layer 109 is formed so as to be spaced from the PDL layer 108, and the spacer 110 is formed on the impact absorbing layer 109, making it possible to prevent damage to the organic light emitting diode due to the impact applied from the outside.

While the present invention has been described in connection with certain exemplary embodiments, it is to be understood that the invention is not limited to the disclosed embodiments, but, on the contrary, is intended to cover various modifications and equivalent arrangements include within the spirit and scope of the appended claims, and equivalents thereof.

What is claimed is:

1. An organic light emitting display comprising:
a first substrate comprising:
an anode electrode on an insulating layer,
a plurality of pixel definition layers on the insulating layer and around the anode electrode,
a plurality of impact absorbing layers directly on the insulating layer and each spaced from the plurality of pixel definition layers, and
a spacer on each of the impact absorbing layers, wherein each spacer is spaced from the pixel definition layers; and
a second substrate facing the first substrate, wherein each of the pixel definition layers are entirely spaced from the second substrate such that an impact to the second substrate is prevented from impacting the pixel definition layers by contacting the second substrate and the spacer.

2. The organic light emitting display as claimed in claim 1, wherein inert gas is in a space between the first substrate and the second substrate.

3. The organic light emitting display as claimed in claim 1, wherein an organic material is in a space between the first substrate and the second substrate.

4. The organic light emitting display as claimed in claim 1, further comprising a buffer layer on the first substrate and a semiconductor layer on the buffer layer.

5. The organic light emitting display of claim 1, wherein all of the pixel definition layers are spaced from the second substrate such that none of the pixel definition layers directly contact the second substrate.

6. A method for manufacturing an organic light emitting display comprising:
forming a thin film transistor on a first substrate;
forming an insulating layer on the thin film transistor;

forming an anode electrode on the insulating layer electrically coupled to the thin film transistor;

forming a plurality of pixel definition layers positioned around the plurality of anode electrodes and forming a plurality of impact absorbing layers directly on the insulating layer and spaced from the plurality of pixel definition layers;

forming a spacer on each of the impact absorbing layers, wherein each spacer is spaced from the pixel definition layers; and placing a second substrate on the spacer, wherein each of the pixel definition layers is entirely spaced from the second substrate such that an impact to the second substrate is prevented from impacting the pixel definition layers by contacting the second substrate and the spacer.

7. The method for manufacturing an organic light emitting display of claim 6, further comprising inserting an inert gas between the insulating layer and the second substrate.

8. The method for manufacturing an organic light emitting display of claim 6, further comprising inserting an organic material between the insulating layer and the second substrate.

9. The method for manufacturing an organic light emitting display of claim 6, wherein the plurality of pixel definition layers and the plurality of impact absorbing layers are made by the same process.

* * * * *